(12) United States Patent
Chen et al.

(10) Patent No.: US 7,180,744 B2
(45) Date of Patent: Feb. 20, 2007

(54) HEAT SINK MOUNTING DEVICE

(75) Inventors: Chun-Chi Chen, Tu-Cheng (TW); Yi-Qiang Wu, ShenZhen (CN); Cheng-Bin Feng, ShenZhen (CN)

(73) Assignees: Fu Zhun Precision Industry (Shenzhen) Co., Ltd. (CN); Hon Hai Precision Industry Co., Ltd. (TW)

( * ) Notice: Subject to any disclaimer, the term of this patent is extended or adjusted under 35 U.S.C. 154(b) by 283 days.

(21) Appl. No.: 11/018,349

(22) Filed: Dec. 20, 2004

(65) Prior Publication Data
US 2005/0174739 A1   Aug. 11, 2005

(30) Foreign Application Priority Data
Jul. 2, 2004   (CN) .................. 2004 1 0027986

(51) Int. Cl.
*H05K 7/20* (2006.01)
(52) U.S. Cl. .............. 361/704; 361/719; 257/718; 257/719; 24/489; 24/520; 165/80.3
(58) Field of Classification Search ............ None
See application file for complete search history.

(56) References Cited

U.S. PATENT DOCUMENTS

| | | | | |
|---|---|---|---|---|
| 5,323,845 | A * | 6/1994 | Kin-shon | 165/80.3 |
| 5,448,449 | A * | 9/1995 | Bright et al. | 361/704 |
| 5,475,564 | A | 12/1995 | Chiou | |
| 5,638,258 | A * | 6/1997 | Lin | 361/704 |
| 6,542,367 | B2 * | 4/2003 | Shia et al. | 361/703 |
| 6,574,109 | B1 * | 6/2003 | McHugh et al. | 361/719 |
| 6,731,506 | B1 * | 5/2004 | Dong et al. | 361/719 |
| 6,785,136 | B2 * | 8/2004 | Chang et al. | 361/704 |

* cited by examiner

*Primary Examiner*—Boris Chervinsky
(74) *Attorney, Agent, or Firm*—Morris Manning & Martin; Tim Tingkang Xia, Esq.

(57) ABSTRACT

A mounting device for a heat sink (200) includes a pair of pivot members (10), two joining members (30), and two pairs of spring members (20). Each pivot member includes a clipping portion (11) for clasping the electric unit (300). The joining members pivotably connect with the pivot members. Each joining member includes a pressing portion (310) for resiliently abutting against the heat sink toward the electric unit. The spring members each includes two end catches (21), (22) secured with the joining member and a corresponding member and capable of providing resilient torsions to drive the clipping portions to engage with the electric unit when the clipping portions rotate to one position away from the electric unit.

21 Claims, 3 Drawing Sheets

HEAT SINK MOUNTING DEVICE

TECHNICAL FIELD

The present invention relates to mounting devices, and particularly to a mounting device for readily mounting a heat sink to a heat generating unit.

BACKGROUND

With the continuing development of computer electronics technology, new electronic units such as a central processing unit (CPU) can perform more and more functions. Heat generated by these modem electronic units has increased commensurately. Therefore, larger and heavier heat sinks are becoming increasingly necessary to efficiently remove the heat from the electronic units. Oftentimes, mounting devices are required for mounting the heat sinks to the electronic units.

A clip is often used to mount a heat sink to an electronic unit. The clip is usually integrally formed from a metal sheet. A typical such clip is formed by bending the sheet to form a pressing body and a pair of latching arms extending from opposite ends of the pressing body. Each latching arm is bent with a suitable angle relative to the pressing body, and defines a hole therein. However, securing of the clip requires a tool. Attachment and detachment of the clip are unduly laborious and time-consuming.

SUMMARY OF THE INVENTION

Accordingly, an object of the present invention is to provide a mounting device which can conveniently mount a heat sink to a heat generating unit.

To achieve the above-mentioned object, a mounting device in accordance with a preferred embodiment of the present invention includes a pair of pivot members, two joining members, and two pair of spring members. Each pivot member includes a clipping portion for clasping the electric unit. The joining members pivotably connect with the pivot members. Each joining member includes a pressing portion for resiliently abutting against the heat sink toward the electric unit. The spring members each includes two end catches secured with the joining member and a corresponding member and capable of providing resilient torsions to drive the clipping portions to engage with the electric unit when the clipping portions rotate to one position away from the electric unit.

Other objects, advantages and novel features of the present invention will be drawn from the following detailed description of a preferred embodiment of the present invention together with the attached drawings, in which:

DETAILED DESCRIPTION OF A PREFERRED EMBODIMENT

Figure 1:
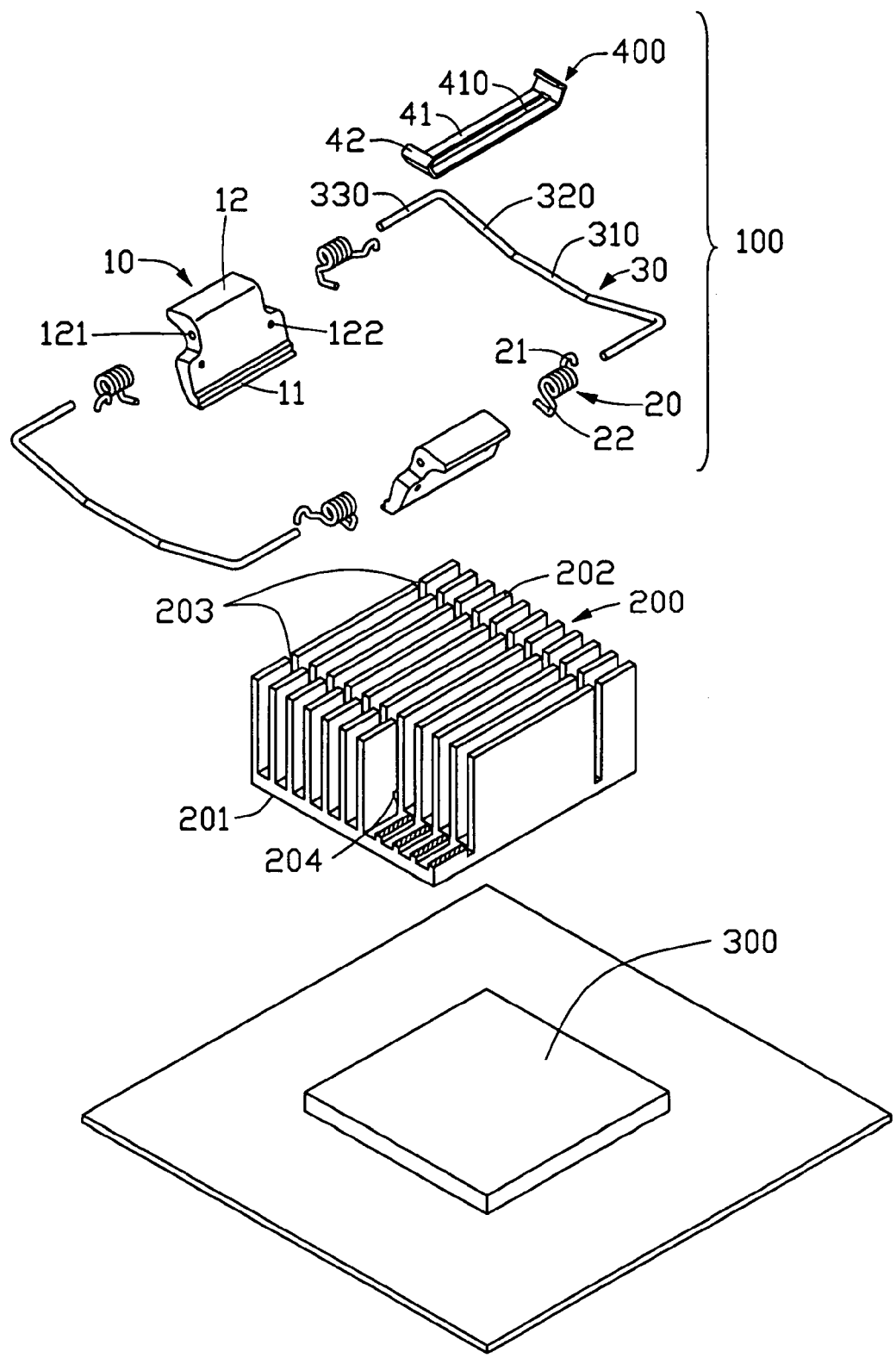
FIG. 1 is an exploded view of a mounting device in accordance with a preferred embodiment of the present invention, together with a heat sink and an electronic unit.

Referring to FIG. 1, a mounting device 100 in accordance with a preferred embodiment of the present invention for mounting a heat sink 200 onto an electronic unit 300 is shown. The heat sink 200 comprises a base 201 and a plurality of parallel fins 202 extending upwardly from the base 201. The heat sink 200 defines two channels 203 crossing through the fins 202. The channels 203 divide each fin 202 into three sections, i.e. two opposite end sections and one middle section. Two cutouts 204 are defined in the end sections of a middle one of the fins 202, communicating with the channels 203 respectively.

The mounting device 100 comprises a pair of pivot members 10, a pair of joining members 30 connecting the pivot members 10, two pairs of spring members disposed around the joining members 30, and a pressing plate 400 holding the mounting device 100 on the heat sink 200.

Each of the joining members 30 is formed by bending a resilient metal pole, and comprises a pressing portion 310, two slanting portions 320 extending from opposite sides of the pressing portion 310, and two connecting portions 330 perpendicularly extending from respective free ends of the slanting portions 320.

Each pivot member 10 comprises an operating portion 12 at a top end thereof, and a clipping portion 11 at a bottom end thereof. The pivot member 10 defines a connecting hole 121 therethrough for pivotably receiving corresponding connecting portions 330 of the joining members 30 at opposite sides of the connecting hole 121. Alternatively, two connecting holes may be defined in the pivot member 10 at opposite sides thereof. Each connecting hole is for receiving a corresponding connecting portion 330. Two catch holes 122 are defined through the pivot member 10 near opposite sides thereof, perpendicular to the connecting hole 121.

The spring members are coil springs 20. Each of the coil springs 20 comprises a coil (not labeled), and two end catches 21, 22 extending from the coil in opposite directions.

The pressing plate 400 comprises a main body 41. A longitudinal groove 410 for receiving the middle section of the middle one of the fins 202 is defined in the centre of the main body 41. Two hook portions 42 extend outwardly and upwardly, and then upwardly and inwardly from opposite ends of the main body 41, for engaging in the cutouts 204 of the heat sink 200.

Figure 2:
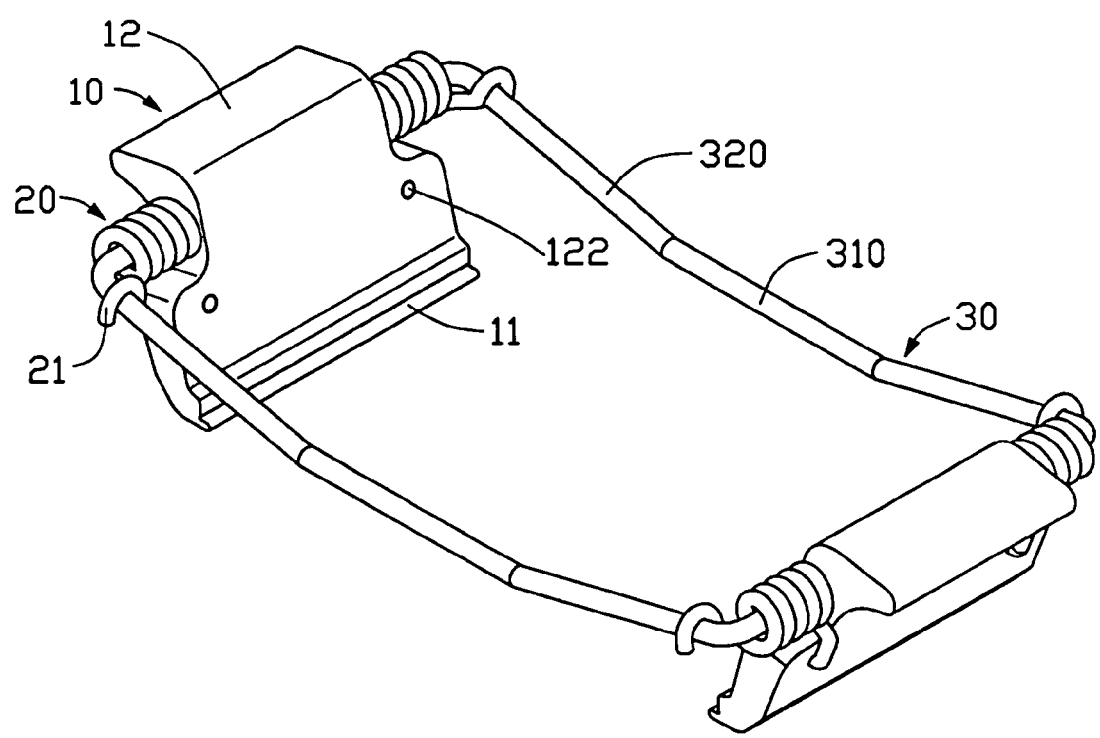
FIG. 2 is a fully assembled view of the mounting device of FIG. 1.
Figure 3:
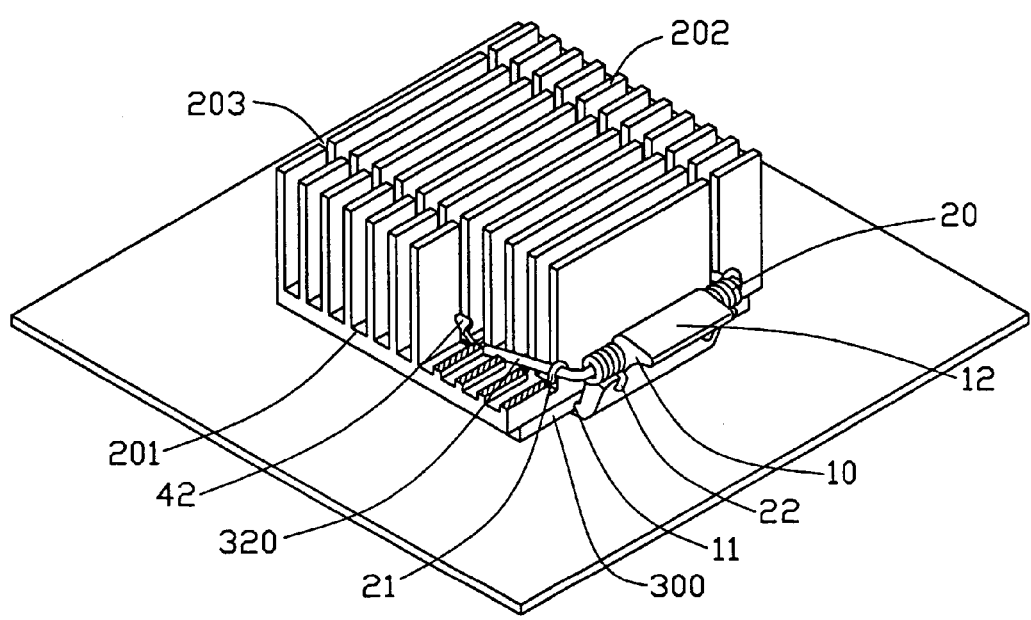
FIG. 3 is a fully assembled view of FIG. 1.

Referring to FIG. 2 and FIG. 3, in assembly of the mounting device 100, the coil springs 20 respectively encircle the connecting portions 330 of the joining members 30. The connecting portions 330 of the joining members 30 extend into the connecting holes 121 of the pivot members 10, thereby pivotably connecting the pivot members 10 to the joining members 30. The end catches 22 of the coil springs 20 are received in the catch holes 122 of the pivot members 10, and the end catches 21 clasp the slanting portions 320 of the joining members 30. In this state, the coil springs 20 of the mounting device 100 are located at loose state. The combination of the pivot members 10, the coil springs 20 and the joining members 30 is then placed on the heat sink 200 with the joining members 30 received in the channels 203 of the heat sink 200. The pressing portions 310 of the jointing members 30 loosely contact with the top surface of the base 201. The pressing plate 400 is placed upon the jointing members 30 with a middle fin 202 of the heat sink 200 received in the groove 410. The pressing plate 400 is pressed toward the base 201 until the hook portions 42 engage into the cutouts 204, thereby preventing the jointing members 30 from being pull away the heat sink 200. Thus, the mounting device 100 is mounted on the heat sink 200.

In assembly of the heat sink 200 on the electronic unit 300, the operating portions 12 of the pivot members 10 are pressed upwardly and inwardly by force to enable the clipping portions 11 of the pivot members 10 to move outwardly away from the heat sink 200 with the end catches 22 of the coil springs 20 twisted outwardly. Under this state, placing the heat sink 200 and the mounting device 100 on the electronic unit 300, an underside of the heat sink 200 loosely contacts an upper side of the electronic unit 300. The operating portions 12 of the pivot members 10 are pressed downwardly, so that the slanting portions 320 of the jointing members 30 downwardly deforms to enable the pressing portions 310 to urge the heat sink 200 toward the electronic unit 300, thereby the underside of the heat sink 200 firmly contacts with the upper side of the electronic unit 300. Thereafter, withdrawing the forces exerted on the operating portions 12 of the pivot members 10, the clipping portions 11 are driven to move inwardly under the resilient torsions of the coil springs 20 until they clasp undersides of the electronic unit 300 respectively. The heat sink 200 is thus firmly secured on the electronic unit 300 by the mounting device 100.

When detaching the heat sink 200 from the electronic unit 300, the operating portions 12 of the pivot members 10 are pressed slightly downwardly and rotate outwardly to cause the clipping portions 11 to disengage from the undersides of the electronic unit 300. Thereafter, the mounting device 100 and the heat sink 200 are easily detached from the electronic unit 300.

In the present invention, the urging forces of the mounting device 100 are generated by coil springs 20. The end catches 21 of the coil springs 20 are fixed at the slanting portions 320 of the jointing members 30 and the end catches 22 rotate outwardly by exerting forces on the operating members 12, which lead the coil springs 20 producing resilient torsions. The torsions of the coil springs 20 urge the clipping portions 11 rotating inwardly after withdrawing the forces exerted on the operating members 12. The heat sink 200 is capable of being attached to the electronic unit 300 by pressing and releasing the operating members 12, and detached from the electronic unit 300 merely by pressing and releasing the operating members 12. No additional tool is required. The mounting device 100 provides easy and convenient operation.

In the preferred embodiment of the present invention, two separate jointing members 30 are used. Alternatively, the two separated jointing members 30 can be united to a resilient frame with the pairs of the pivot members 10 located at opposite sides of the frame. In addition, the jointing members 30 can also be a bended metal plate. Further, the spring member can be any resilient apparatus capable of providing resilient torsion to secure the heat sink 200 on the electronic unit 300.

It is understood that the invention may be embodied in other forms without departing from the spirit thereof. Thus, the present examples and embodiments are to be considered in all respects as illustrative and not restrictive, and the invention is not to be limited to the details given therein.

What is claimed is:

1. A mounting device for mounting a heat sink to an electric unit comprising:
   at least a pair of pivot members, each of the pivot members comprising a clipping portion for clasping the electric unit;
   at least a jointing member pivotably connected with the pivot members, the jointing member comprising a pressing portion for resiliently abutting against the heat sink toward the electric unit; and
   at least a pair of spring members each comprising two end catches secured with the jointing member and a corresponding pivot member and capable of providing resilient torsions to drive the clipping portions to engage with the electric unit when the clipping portions rotate to one position away from the electric unit.

2. The mounting device as described in claim 1, further comprising a pressing plate for retaining the combination of the pivot members and the jointing member on the heat sink.

3. The mounting device as described in claim 2, wherein the pressing plate comprises a main body, a longitudinal groove defined in the centre of the main body, and two hook portions extending from opposite ends of the main body.

4. The mounting device as described in claim 1, wherein each jointing member comprises two slanting portions extending from opposite sides of the pressing portion, and two connecting portions extending from free ends of the slanting portions, and each pivot member defines a connecting hole receiving a corresponding connecting portion.

5. The mounting device as described in claim 4, wherein the mounting device comprises two jointing members located at opposite sides of the pivot members.

6. The mounting device as described in claim 5, wherein each jointing member is formed by bending a metal pole.

7. The mounting device as described in claim 5, wherein each jointing member is formed by bending a metal plate.

8. The mounting device as described in claim 4, wherein the spring members are coil springs, each pivot member defines at least a catch hole therein, one end catch of the coil spring is received in a corresponding catch hole, and the other end catch clasps a corresponding slanting portion of the jointing member.

9. A heat dissipating device comprising:
   a heat sink for contacting with an electric unit;
   at least one jointing member comprising a pressing portion abutting the heat sink;
   a pair of pivot members pivotably connected with the jointing member, each of the pivot members comprising a clipping portion for clasping the electric unit; and
   at least a pair of spring members connected with the pivot members and the jointing member to provide resilient torsions to drive the pivot members to rotate from a first position in which the clipping portions are located away from the heat sink to a second position in which the clipping portions engage with the electric unit to secure the heat sink on the electric unit.

10. The heat dissipating device as described in claim 9, wherein the heat sink comprises a base and a plurality of fins extending from the base, two channels are defined crossing through the fins for receiving the jointing member, and the channels divide each fin into two opposite end sections and one middle section.

11. The heat dissipating device as described in claim 10, further comprising a pressing plate for mounting the combination of the pivot member and the jointing member to the heat sink, wherein the pressing plate comprises a main body defining a groove for extension of the middle section of a middle one of the fins, and two hook portions extending from opposite ends of the main body, two cutouts being defined in the end sections of the middle one of the fins and the hook portions engaging in the cutouts.

12. The heat dissipating device as described in claim 9, wherein each jointing member comprises two slanting portions extending from opposite sides of the pressing portion, and two connecting portions extending from free ends of the slanting portions.

13. The heat dissipating device as described in claim 12, wherein each pivot member defines a connecting hole receiving the connecting portions and two catch holes perpendicular to the connecting hole.

14. The heat dissipating device as described in claim 13, wherein each spring member comprises a coil, and two end catches extending from opposite sides of the coil, one of the end catches is received in a corresponding catch hole, and the other end catch clasps one of the slanting portions.

15. A heat dissipating assembly comprising:
   a heat sink for contacting with an electric unit;
   a resilient body extending across the heat sink with two opposite ends of the resilient body located at two opposite sides of the heat sink, at least a portion of the resilient body being capable of urging the heat sink toward the electric unit;
   a pair of pivot members respectively pivotably attached to the resilient body; and
   a pair of biasing members each comprising two end catches secured with the resilient body and a corresponding pivot member to bias the pivot member to pivot from a released position to an engaged position.

16. The assembly of claim 15, wherein each of the pivot members defines a connecting hole pivotably receiving a corresponding end of the resilient body.

17. The assembly of claim 15, wherein the biasing member is a torsional spring.

18. The assembly of claim 15, wherein each of the pivot members defines a catch hole receiving one end catch of the biasing member therein, and the other end catch of the biasing member clasps the resilient body.

19. The assembly of claim 15, wherein each of the pivot members comprises a clipping portion, and the clipping portions engage with undersides of the electric unit in said engaged position.

20. A mounting device for mounting a heat sink to an electric unit comprising:
   at least one jointing member attached to said heat sink, and having a pressing portion resiliently engagable with said heat sink and at least one connecting portion extending from said jointing member and out of said heat sink; and
   a pivot member disposed next to said heat sink and torsionally attached to said at least one connecting portion of said jointing member, said pivot member being movable between a first position where said pivot member engages with said electric unit to generate an urging force on said joint member via said at least one connecting portion thereof so as to move said heat sink toward said electric unit by means of said pressing portion thereof, and a second position where said pivot member disengages from said electric unit so as to make said heat sink removable from said electric unit, said pivot member being torsionally moved to initiate movement of said pivot member from said first position to said second position.

21. The mounting device as described in claim 20, wherein said jointing member is fixedly attached to said heat sink via a pressing plate engagable with fins of said heat sink.

* * * * *